United States Patent
Dosev

(10) Patent No.: US 10,662,058 B1
(45) Date of Patent: May 26, 2020

(54) WET ETCH PATTERNING OF AN ALUMINUM NITRIDE FILM

(71) Applicant: Rosemount Aerospace Inc., Burnsville, MN (US)

(72) Inventor: Dosi Dosev, Chanhassen, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 16/292,926

(22) Filed: Mar. 5, 2019

(51) Int. Cl.
  *H01L 33/00* (2010.01)
  *H01L 33/16* (2010.01)
  *H01L 33/32* (2010.01)
  *B81C 1/00* (2006.01)

(52) U.S. Cl.
  CPC .. *B81C 1/00595* (2013.01); *B81C 2201/0133* (2013.01)

(58) Field of Classification Search
  None
  See application file for complete search history.

(56) References Cited

U.S. PATENT DOCUMENTS

| | | | | |
|---|---|---|---|---|
| 6,693,021 B1 * | 2/2004 | Motoki | ............ | B82Y 20/00 117/84 |
| 8,460,987 B2 | 6/2013 | Aid et al. | | |
| 8,540,888 B1 | 9/2013 | Yang et al. | | |
| 2019/0103506 A1 * | 4/2019 | Chen | ............ | H01L 33/0075 |

OTHER PUBLICATIONS

Abels, Claudio et al., "Nitrate-Based Materials for Flexible MEMS Tactile and Flow Sensors in Robotics", May 10, 2017, Center for Biomolecular Nanotechnogies, 25 pages.
Mileham, J.R. et al., "Patterning of AlN, InN, and GaN in KOH-based solutions", Journal of Vacuum Science & Technology, 14, 836, 1996, 5 pages.
Yang, Jian et al., "Researching the Aluminum Nitride Etching Process for Application in MEMS Resonators", Micromachines 2015, 6, 281-290, Feb. 16, 2015, 10 pages.
Zhuang D. and Edgar J.H., "Wet etching of GaN, AlN, and SiC: a review", Materials Science and Engineering R 48 (2005) 1-46, Jan. 20, 2005, 46 pages.

\* cited by examiner

*Primary Examiner* — Angel Roman
(74) *Attorney, Agent, or Firm* — Kinney & Lange, P.A.

(57) ABSTRACT

A method of manufacturing a patterned aluminum nitride layer includes growing an amorphous patterned layer on a seed layer, which promotes growth of a first type aluminum nitride layer that has a disordered crystallographic structure. The seed layer promotes growth of a second type aluminum nitride layer with a vertically oriented columnar crystal structure. The method also includes depositing an aluminum nitride layer over the amorphous patterned layer and the seed layer to form the first type aluminum nitride layer with the disordered crystallographic structure over the amorphous patterned layer and the second type aluminum nitride layer with the vertically oriented columnar crystal structure over the seed layer. The method also includes depositing a masking layer over the second type aluminum nitride layer and etching away the first type aluminum nitride layer.

13 Claims, 1 Drawing Sheet

WET ETCH PATTERNING OF AN ALUMINUM NITRIDE FILM

STATEMENT OF GOVERNMENT INTEREST

This invention was made with government support under Contract No. W911QX18C0021 awarded by Defense Advanced Research Projects Agency (DARPA). The government has certain rights in the invention.

BACKGROUND

Flexible functional materials can be used to tune and efficiently control how mechanical information can be detected and transferred in a biomimetic sensor design. Developments in thin-film-based MEMS (Micro-Electro-Mechanical Systems) have enabled the cost-effective manufacture of these flexible functional materials. These flexible elements can be, for example, cantilever beams, membranes, and bridges that are suspended over a base layer. Additional layers are added to the base using appropriate deposition techniques to create a controllable stress gradient across the layered structure. On release, the stress gradient creates "out-of-plane" architectures, such as upwards-bent cantilevers or dome-shaped membranes, yielding mechanical devices that are sensitive to normal and shear forces. Such MEMS can be sensitive to environmental changes in tactile, pressure, and flow characteristics.

Traditionally, two methods have been employed to manufacture MEMS. On the one hand, dry etch techniques using chlorine based chemistries and reactive ion etching are the most prevalent. However, these typically require the use of very reactive and toxic gases and the use of specialized equipment, which necessitate implementation of complex systems and capital intensive investments in order to meet desired capabilities while also meeting stringent safety requirements. As such, dry etch suffers from not only high initial investment costs, but also relatively low throughput capabilities. On the other hand, wet etch techniques suffer from inconsistent etch rates for some materials. As such, previous techniques have not provided a way to reliably pattern those materials.

SUMMARY

A method of manufacturing a patterned aluminum nitride layer includes growing an amorphous patterned layer on a seed layer. The amorphous patterned layer promotes growth of a first type aluminum nitride layer that has a disordered crystallographic structure. The seed layer promotes growth of a second type aluminum nitride layer with a vertically oriented columnar crystal structure. The method also includes depositing an aluminum nitride layer over the amorphous patterned layer and the seed layer to form the first type aluminum nitride layer with the disordered crystallographic structure over the amorphous patterned layer and the second type aluminum nitride layer with the vertically oriented columnar crystal structure over the seed layer. The method also includes depositing a masking layer over the second type aluminum nitride layer and etching away the first type aluminum nitride layer.

DETAILED DESCRIPTION

The present disclosure relates generally to the manufacturing of MEMS. More specifically, this disclosure relates to the patterning of an aluminum nitride (AlN) layer within a MEMS using a wet etch technique.

AlN is a material of interest in the MEMS manufacturing industry because it has desirable dielectric and piezoelectric properties and is compatible with current CMOS manufacturing processes. AlN also has a high thermal conductivity. As such, AlN can withstand relatively harsh working environments, such as elevated temperature and pressure, which may be present in a working aircraft engine. For example, a MEMS sensor having an AlN layer may be desirable to use within a working aircraft engine because of AlN's tolerance to elevated temperatures and pressures.

However, the ability to selectively etch away AlN to form a patterned layer has been difficult to achieve. As such, AlN layers with a non-uniform or unknown crystal quality leads to devices of poor quality because the etching rate of the AlN is highly dependent upon the crystal quality of the AlN layer. This leads to inconsistent AlN pattern formation. High quality AlN films can have a vertically oriented columnar crystal structure. For consistent AlN pattern formation, previous patterning methods have required the use of dry etch techniques, which is slow and expensive. Described herein is a method for depositing layers of AlN with a locally controlled and modified crystal quality. For example, an AlN layer with a desired pattern can be deposited having a high crystal quality, such as a vertically oriented columnar crystal structure, whereas, on other areas (the negative pattern) an AlN layer having a poor crystal quality, such as a disordered or random crystal structure, can be deposited. The AlN having a relatively poor crystal quality can then be selectively etched away using wet etch techniques.

Figure 1A:
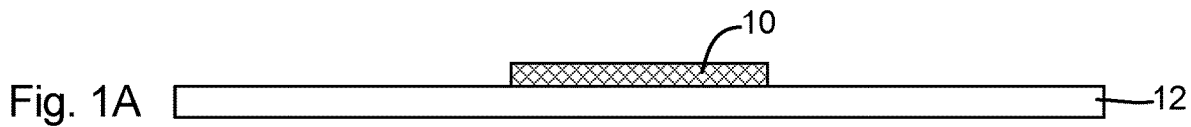
FIGS. 1A-1F shows a process of patterning an AlN layer in one embodiment of the disclosure.

FIGS. 1A-1F shows a process of patterning an AlN layer in one embodiment of the disclosure. In a first step, an amorphous layer 10, having a negative pattern relative to the desired final AlN patterned layer, is deposited on top of a base layer 12. FIG. 1A is a cross-sectional view of base layer 12 with amorphous layer 10 (having a desired pattern that is the negative image of the desired pattern of the AlN layer) deposited on top of base layer 12. Base layer 12 can be any crystal substrate which promotes growth of an AlN layer having a highly ordered crystal structure. Base layer 12 can be, for example, a silicon crystal surface or a molybdenum layer.

Amorphous layer 10 can be any formed of any material which promotes growth of an AlN layer having a poorly ordered crystal structure relative to the AlN layer grown on base layer 12. Amorphous layer 10 can be formed of, for example, silicon dioxide ($SiO_2$) or silicon nitride ($Si_3N_4$). The thickness of amorphous layer 10 is typically from 20 nm to 50 nm measured in a perpendicular direction from the top of base layer 12. Amorphous layer 10 can be deposited by any technique known in the art. For example, amorphous layer 10 formed of $SiO_2$ or $Si_3N_4$ having an appropriate thickness can be deposited using plasma enhanced chemical vapor deposition in about 10 minutes at 200° C. Alternatively, $SiO_2$ can also be thermally grown at temperatures around 900° C. and above. Alternatively, a thermal oxide layer may already be present from a previous processing step. The thermal oxide layer may already be deposited having a desired pattern or the thermal oxide layer may need further processing to achieve the desired pattern.

Figure 1B:
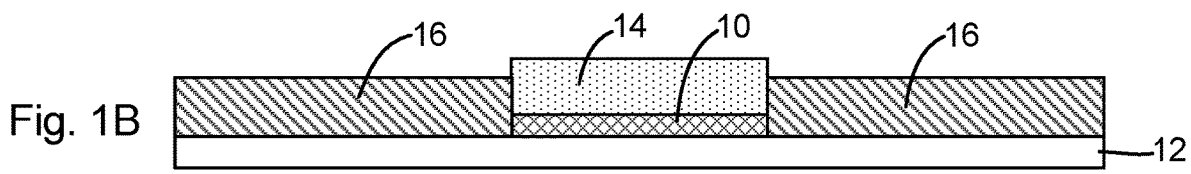

In a next step, AlN is deposited simultaneously on top of both amorphous layer 10, which has the negative image of the desired pattern of the AlN layer, and base layer 12, which has the desired pattern of the final AlN layer. FIG. 1B is a cross-sectional view of base layer 12 with amorphous layer 10 deposited on top of base layer 12, first type AlN layer 14 deposited on top of amorphous layer 10, and second type AlN layer 16 deposited directly on top of base layer 12. The simultaneous deposition of AlN on both amorphous layer 10 and base layer 12 results in two distinct AlN layers being formed, differentiated by the resulting crystal quality of first type AlN layer 14 compared to second type AlN layer 16. First type AlN layer 14 has a poorly ordered crystal structure whose disordered growth is promoted by underlying amorphous layer 10. Second type AlN layer 16 has a more ordered crystal structure relative to first type AlN layer 14. The more ordered crystal structure can be a vertically oriented columnar crystal structure whose growth is promoted by underlying base layer 12. First type AlN layer 14 and second type AlN layer 16 may be deposited by any known method in the art. For example, AlN is usually deposited by sputtering techniques at or below 400° C. The thickness of the AlN layer can be from 500 nm to 1000 nm measured in a perpendicular direction from the top of the adjacent underlying layer. The thickness of the AlN layer can also be from 600 nm to 900 nm. The thickness of the AlN layer can also be from 700 nm to 800 nm.

Figure 1C:
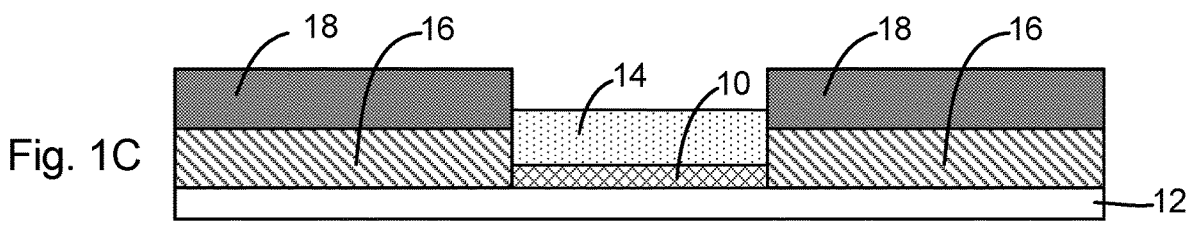

In a next step, masking layer 18 is deposited on top of second type AlN layer 16. FIG. 1C is a cross-sectional view of base layer 12 with amorphous layer 10 deposited on top of base layer 12, first type AlN layer 14 deposited on top of amorphous layer 10, second type AlN layer 16 deposited directly on top of base layer 12, and masking layer 18 on top of second type AlN layer 16. Masking layer 18 can be formed from any material which inhibits the etching rate of second type AlN layer 16 relative to the etching rate of first type AlN layer 14. For example, masking layer 18 can be a photoresist, which is typically a light-sensitive organic material. A photoresist layer can be applied and then a patterned mask is used to selectively block the light. A developing agent is then applied, which removes the masking material from unwanted areas. The desired pattern of masking layer 18, which can have the same pattern as second type AlN layer 16, is left behind as shown in FIG. 1C. Alternatively, masking layer 18 can be formed from a metal oxide such as $SiO_2$.

Figure 1D:
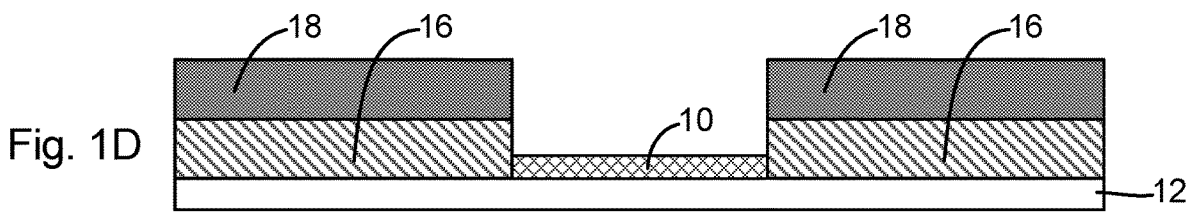

In a next step, first type AlN layer 14 is removed. FIG. 1D is a cross-sectional view of base layer 12 with amorphous layer 10 deposited on top of base layer 12, second type AlN layer 16 deposited directly on top of base layer 12, and masking layer 18 on top of second type AlN layer 16. First type AlN layer 14 is preferably removed by a wet etching process, such as potassium hydroxide or phosphoric acid based chemistries. For example, the commercial composition AZ® 400K, which contains NaOH and KOH, can etch AlN at the rate of hundreds of nm/min. The exact rate depends primarily upon the concentration of KOH and the wet etch temperature used.

The wet etch rates for disordered structures of AlN are much higher than that for more ordered crystal structures of AlN, such as vertically oriented columnar crystal structures. As such, first type AlN layer 14 is selectively removed at a much higher rate compared to second type AlN layer 16 due to the relative disordered crystal structure of first type AlN layer 14 compared to the ordered crystal structure of second type AlN layer 16. Masking layer 18 protects second type AlN layer 16 from wet etching. Although the etching selectivity for first type AlN layer 14 is higher compared to second type AlN layer 16, some undercutting of second type AlN layer 16 is likely to occur, especially near the masking layer transitions.

Figure 1E:
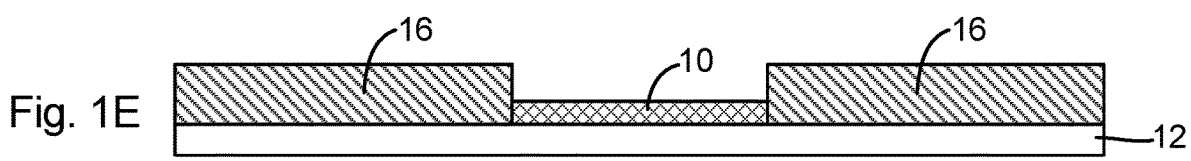

In a next step, masking layer 18 is removed. FIG. 1E is a cross-sectional view of base layer 12 with amorphous layer 10 deposited on top of base layer 12 and second type AlN layer 16 deposited directly on top of base layer 12. Masking layer 18 can be removed by any method known in the art.

Figure 1F:
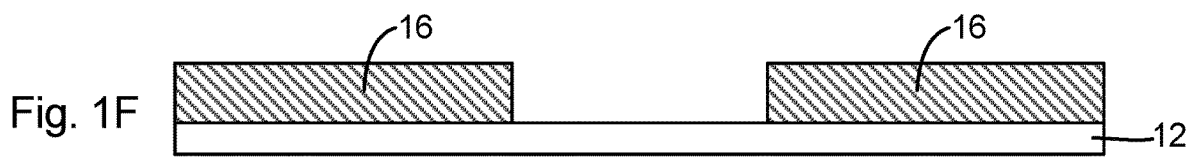

In a next step, amorphous layer 10 is removed. FIG. 1F is a cross-sectional view of base layer 12 and second type AlN layer 16 deposited directly on top of base layer 12. Amorphous layer 10 can be removed by any method known in the art. For example, hydrogen fluoride can be used to remove $SiO_2$ at 30° C. in less than 5 minutes. Alternatively, phosphoric acid can be used to remove $Si_3N_4$ at 180° C. in about 5-10 minutes.

Alternatively, amorphous layer 10 can be removed prior to masking layer 18. Alternatively, masking layer 18 and amorphous layer 10 can be removed simultaneously in a single step. For example, if amorphous layer 10 and masking layer 18 are both formed of $SiO_2$, then both layers can be removed simultaneously using hydrogen fluoride at 30° C.

Additional layers of AlN or other alloys or other metals can be added using a variety of thin-film and bonding techniques as well as by etching through sacrificial layers to build a final structure. This can continue until a MEMS with a desired geometry has been built, which can be used, for example, as sensors, actuators, and complex systems. These MEMS can include, for example, motors, bearings, gears, and linkages formed by using appropriate deposition patterns, masking patterns, and etching techniques. These MEMS can be manufactured together with an integrated circuit or manufactured separately and assembled later.

Using wet etching chemistries to remove the relatively disordered AlN crystal structure obviates the need to use dry etch techniques, which require expensive equipment and materials to start up and the use of toxic chemicals. Furthermore, using wet etch chemistries to remove the relatively disordered AlN allows for batch processing, which greatly increases throughput compared to dry etch techniques. Wet etching of AlN also does not introduce additional contaminants into current CMOS manufacturing processes.

Discussion of Possible Embodiments

The following are non-exclusive descriptions of possible embodiments of the present invention.

A method of manufacturing a patterned aluminum nitride layer includes growing an amorphous patterned layer on a seed layer that promotes growth of a first type aluminum nitride layer having a disordered crystallographic structure. The seed layer promotes growth of a second type aluminum nitride layer with a vertically oriented columnar crystal structure. The method also includes depositing aluminum nitride over the amorphous patterned layer and the seed layer to form the first type aluminum nitride layer with the disordered crystallographic structure over the amorphous patterned layer and the second type aluminum nitride layer with the vertically oriented columnar crystal structure over the seed layer. The method also includes depositing a masking layer over the second type aluminum nitride layer and etching away the first type aluminum nitride layer.

The method of the preceding paragraph can optionally include, additionally and/or alternatively, any one or more of the following:

The method includes removing the masking layer and removing the amorphous patterned layer.

The seed layer is formed of silicon or molybdenum.

The amorphous patterned layer is formed of silicon dioxide or silicon nitride.

A thickness of the second type aluminum nitride layer is from 500 nm to 1000 nm, inclusive.

The etching away the first type aluminum nitride layer further includes exposing the first type aluminum nitride layer to potassium hydroxide.

The potassium hydroxide is provided by the chemical composition AZ® 400K.

The etching away includes exposing the aluminum nitride covered amorphous patterned layer to phosphoric acid.

The method also includes using the patterned aluminum nitride layer in a sensor.

A device having an aluminum nitride patterned layer made by a method which includes the steps of growing an amorphous patterned layer on a seed layer that promotes growth of a first type aluminum nitride layer having a disordered crystallographic structure. The seed layer promotes growth of a second type aluminum nitride layer with a vertically oriented columnar crystal structure. The method also includes depositing aluminum nitride over the amorphous patterned layer and the seed layer to form the first type aluminum nitride layer with the disordered crystallographic structure over the amorphous patterned layer and the second type aluminum nitride layer with the vertically oriented columnar crystal structure over the seed layer. The method also includes depositing a masking layer over the second type aluminum nitride layer and etching away the first type aluminum nitride layer.

The device is a sensor.

The device is an actuator.

A method of manufacturing a patterned aluminum nitride layer includes growing an amorphous patterned layer on a seed layer that promotes growth of a first type aluminum nitride layer having a disordered crystallographic structure. The seed layer promotes growth of a second type aluminum nitride layer with a vertically oriented columnar crystal structure. A thickness of the first and second type aluminum nitride layer is from 500 nm to 1000 nm, inclusive. The method also includes depositing aluminum nitride over the amorphous patterned layer and the seed layer to form the first type aluminum nitride layer with the disordered crystallographic structure over the amorphous patterned layer and the second type aluminum nitride layer with the vertically oriented columnar crystal structure over the seed layer. The method also includes depositing a masking layer over the second type aluminum nitride layer; etching away the first type aluminum nitride layer; removing the masking layer; and removing the amorphous patterned layer.

The method of the preceding paragraph can optionally include, additionally and/or alternatively, any one or more of the following:

The etching away the first type aluminum nitride layer further includes exposing the first type aluminum nitride layer to potassium hydroxide.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of manufacturing a patterned aluminum nitride layer, the method comprising:
    growing an amorphous patterned layer on a seed layer, wherein the amorphous patterned layer promotes growth of a first type aluminum nitride layer having a disordered crystallographic structure and wherein the seed layer promotes growth of a second type aluminum nitride layer with a vertically oriented columnar crystal structure;
    depositing aluminum nitride over the amorphous patterned layer and the seed layer to form the first type aluminum nitride layer with the disordered crystallographic structure over the amorphous patterned layer and the second type aluminum nitride layer with the vertically oriented columnar crystal structure over the seed layer;
    depositing a masking layer over the second type aluminum nitride layer; and
    etching away the first type aluminum nitride layer.

2. The method of claim 1, and further comprising:
    removing the masking layer; and
    removing the amorphous patterned layer.

3. The method of claim 1, wherein the seed layer is formed of silicon or molybdenum.

4. The method of claim 1, wherein the amorphous patterned layer is formed of silicon dioxide or silicon nitride.

5. The method of claim 1, wherein a thickness of the second type aluminum nitride layer is from 500 nm to 1000 nm, inclusive.

6. The method of claim 1, wherein the etching away the first type aluminum nitride layer further comprises exposing the first type aluminum nitride layer to potassium hydroxide.

7. The method of claim 1, wherein the etching away includes exposing the aluminum nitride covered amorphous patterned layer to phosphoric acid.

8. The method of claim 1, and further comprising:
    using the patterned aluminum nitride layer in a sensor.

9. A device having an aluminum nitride patterned layer made by the method of claim 1.

10. The device of claim 9, wherein the device is a sensor.

11. The device of claim 9, wherein the device is an actuator.

12. A method of manufacturing a patterned aluminum nitride layer, the method comprising:
    growing an amorphous patterned layer on a seed layer, wherein the amorphous patterned layer promotes growth of a first type aluminum nitride layer having a disordered crystallographic structure and wherein the seed layer promotes growth of a second type aluminum nitride layer with a vertically oriented columnar crystal structure, wherein a thickness of the first and second type aluminum nitride layer is from 500 nm to 1000 nm, inclusive;
    depositing aluminum nitride over the amorphous patterned layer and the seed layer to form the first type aluminum nitride layer with the disordered crystallographic structure over the amorphous patterned layer and the second type aluminum nitride layer with the vertically oriented columnar crystal structure over the seed layer;
    depositing a masking layer over the second type aluminum nitride layer;
    etching away the first type aluminum nitride layer;

removing the masking layer; and
removing the amorphous patterned layer.

13. The method of claim 12, wherein etching away the first type aluminum nitride layer further comprises exposing the first type aluminum nitride layer to potassium hydroxide.

\* \* \* \* \*